United States Patent
Nawata et al.

(10) Patent No.: US 7,364,715 B2
(45) Date of Patent: *Apr. 29, 2008

(54) AS-GROWN SINGLE CRYSTAL OF ALKALINE EARTH METAL FLUORIDE

(75) Inventors: Teruhiko Nawata, Shunan (JP);
Nobuyuki Kuramoto, Shunan (JP);
Hiroyuki Yanagi, Shunan (JP); Tsuguo Fukuda, Sendai (JP)

(73) Assignee: Tokuyama Corporation (JP)

( * ) Notice: Subject to any disclaimer, the term of this patent is extended or adjusted under 35 U.S.C. 154(b) by 88 days.

This patent is subject to a terminal disclaimer.

(21) Appl. No.: 10/717,281

(22) Filed: Nov. 19, 2003

(65) Prior Publication Data

US 2004/0107893 A1 Jun. 10, 2004

(30) Foreign Application Priority Data

Nov. 19, 2002 (JP) ............................. 2002-334624
Feb. 3, 2003 (JP) ............................. 2003-025532
Jun. 17, 2003 (JP) ............................. 2003-171605

(51) Int. Cl.
*C30B 29/12* (2006.01)
*C30B 15/14* (2006.01)
*G02B 1/02* (2006.01)

(52) U.S. Cl. .................... 423/490; 423/489; 117/13
(58) Field of Classification Search ............... 423/489, 423/490, 497; 117/13
See application file for complete search history.

(56) References Cited

U.S. PATENT DOCUMENTS 6,309,461 B1* 10/2001 Gianoulakis et al. ....... 117/206

(Continued)

FOREIGN PATENT DOCUMENTS

EP 0 939 147 A2 9/1999

(Continued)

OTHER PUBLICATIONS

K. Nassau, "Application of the Czochralski Method to Divalent Metal Fluorides", Journal of Applied Physics, vol. 32, No. 10, (1961), pp. 1820-1821, Bell Telephone Laboratories, Inc., Murray Hill, New Jersey, U.S.A., no month.

(Continued)

*Primary Examiner*—Ngoc-Yen Nguyen
(74) *Attorney, Agent, or Firm*—The Webb Law Firm, P.C.

(57) ABSTRACT

A single crystal of alkaline earth metal fluoride is produced by a single crystal pulling method, has a straight barrel part diameter of not less than 17 cm, preferably has a straight barrel part length of not less than 5 cm, and has a light transmittance, as measured at a wavelength of 632.8 nm, of not less than 80%, preferably 90 to 98%. Further, the main crystal growth plane of the single crystal is the {111} plane or the {100} plane. The single crystal of alkaline earth metal fluoride has a large diameter as described above, and in spite that it is in an as-grown state, the peripheral surface is not opaque and the visible light transmittance is high. Therefore, evaluation of bubbles or inclusions in the crystal becomes feasible without performing complicated machining of the crystal, and from the single crystal, a large-sized optical material having advantageous properties such as high quality and high uniformity can be cut out.

14 Claims, 1 Drawing Sheet

U.S. PATENT DOCUMENTS

| | | | |
|---|---|---|---|
| 6,332,922 B1 * | 12/2001 | Sakuma et al. | 117/3 |
| 6,369,392 B1 | 4/2002 | Ruderman et al. | |
| 6,673,150 B2 * | 1/2004 | Garibin et al. | 117/223 |
| 2001/0008540 A1 | 7/2001 | OBA et al. | |
| 2004/0099205 A1 * | 5/2004 | Li et al. | 117/2 |

FOREIGN PATENT DOCUMENTS

| | | | |
|---|---|---|---|
| JP | 63-270385 A | | 11/1988 |
| JP | 11-021197 A | | 1/1999 |
| JP | 2000272990 A | * | 10/2000 |
| JP | 2002-234795 A | | 8/2002 |

OTHER PUBLICATIONS

Shinichiro Tozawa, et al., "Modification of Optical Material CaF2", report of technical research by Institute for Material Research of Tohoku University, No. 19 (2001) Japan, (partial English translation attached), no month.

J. M. Ko, et al., "Czochralski growth of UV-grade CaF2 single crystals using ZnF2 addititve as scavenger", Journal of Crystal Growth 222 (2001), pp. 243-248, N•H Elsevier, Japan, no month.

* cited by examiner

AS-GROWN SINGLE CRYSTAL OF ALKALINE EARTH METAL FLUORIDE

FIELD OF THE INVENTION

The present invention relates to an as-grown single crystal of alkaline earth metal fluoride produced by a single crystal pulling method.

BACKGROUND OF THE INVENTION

Single crystals of metal fluorides such as calcium fluoride and barium fluoride have high transmittance over a wide wavelength region, cause little light scattering and have excellent chemical stability. Therefore, a requirement for them as optical materials, such as lenses and aperture materials of various instruments using laser beam of ultraviolet wavelength or vacuum ultraviolet wavelength, cameras and CVD devices, has been widespread. Particularly, single crystals of alkaline earth metal fluoride, such as calcium fluoride and barium fluoride, are expected as projection lenses used with $F_2$ laser (157 nm) which has been developed as a short wavelength light source of the next generation in the photolithographic technology.

It has been reported that when a single crystal of alkaline earth metal fluoride is used as the projection lens, intrinsic birefringence of the alkaline earth metal fluoride, which causes unclearness of the projected image, can be remarkably reduced by combining a lens taking its optical axis perpendicularly to the {111} plane of the single crystal with a lens taking its optical axis perpendicularly to the {100} plane of the single crystal. As the projection lenses, those having a diameter of not less than 15 cm are generally adopted in order to improve throughput of lithography, and hence, single crystals of large-sized alkaline earth metal fluorides having a diameter of more than 17 cm are required as the lens materials.

Such large-sized single crystals of alkaline earth metal fluorides have been generally produced heretofore by a crucible depression method (Bridgman's method). The crucible depression method is a method wherein a melt of a starting material for forming a single crystal in a crucible is cooled with slowly depressing the crucible containing the starting material to thereby grow a single crystal in the crucible.

In the as-grown single crystal of alkaline earth metal fluoride produced by the crucible depression method, however, there resides a problem that the peripheral surface of the resulting single crystal becomes opaque because the single crystal is formed in such a state that the inner wall of the crucible is in contact with a liquid surface of the starting material melt. As a result, the as-grown crystal obtained has bad visible light transmittance, and therefore, inspection of the internal state, particularly inspection of bubbles or micro-defects included, becomes difficult by visual observation, so that such inspection needs to be carried out after complicated treatment such as cutting or polish of the crystal is performed. Further, especially when a large-sized single crystal of more than 17 cm is grown, the crystal is partially polycrystallized, and hence there is a disadvantage of extremely bad yield.

In order to solve the above problems of the crucible depression method, it is thought that the single crystals of alkaline earth metal fluorides are produced by a single crystal pulling method (Czochralski method). The single crystal pulling method is a method wherein a seed crystal made of the desired single crystal is brought into contact with a melt of a starting material for forming a single crystal placed in a crucible and then slowly pulled from the heating zone of the crucible to cool it and thereby grow a single crystal under the seed crystal. In the single crystal pulling method, the crystal surface is not in contact with the crucible during the growth of a single crystal, so that the surface of the crystal becomes smooth, and besides reduction of impurities due to segregation phenomenon during the crystal growth is possible. Hence, the single crystal pulling method is generally employed for producing semiconductor single crystals such as silicon and germanium.

In the single crystal pulling method, however, the apparatus is complicated, and it is difficult to stably grow crystals, so that in the application of this method to the production of the single crystals of alkaline earth metal fluorides, considerable difficulties are foreseen. With regard to the production of single crystals of alkaline earth metal fluorides by the single crystal pulling method, therefore, an example wherein a small-sized single crystal having a straight barrel part diameter of about 10 cm is produced on a labo-scale is only known (see Shinichiro Tozawa, et al. "Modification of Optical Material $CaF_2$", report of technical research by Institute for Material Research of Tohoku University, No. 19 (2001), and K. Nassau, *Journal of Applied Physics*, Vol. 32, 1820-1821 (1961)).

In the actual circumstances, production of a large-diameter single crystal of alkaline earth metal fluoride having a diameter of not less than 17 cm which is made by the single crystal pulling method is rarely known, but in Japanese Patent Laid-Open Publication No. 21197/1999, there is reported a single crystal of alkaline earth metal fluoride of 25 cm diameter obtained by a crucible depression method or a single crystal pulling method using a seed crystal in which the main growth plane and at least one plane of the side planes belong to the same plane orientation ({111} or {100}).

Under such circumstances as mentioned above, the present inventors have attempted to produce a large-diameter single crystal of alkaline earth metal fluoride having a straight barrel part diameter of not less than 17 cm by a single crystal pulling method using such a single crystal pulling apparatus of general structure as described in Japanese Patent Laid-Open Publication No. 21197/1999. However, the peripheral surface of the resulting single crystal in an as-grown state was still considerably opaque. Such opaqueness was solved in the aforesaid production of a small-sized single crystal of alkaline earth metal fluoride by a single crystal pulling method on the labo-scale, and this is a problem having newly occurred with production of a large-sized single crystal of alkaline earth metal fluoride.

The opaqueness lowers visible light transmittance of single crystals as previously described and becomes a serious obstacle to the industrial production of large-diameter single crystals of alkaline earth metal fluorides, so that the solution is desired.

The present invention overcomes the problems and shortcomings of the prior art by providing an as-grown single crystal of alkaline earth metal fluoride having a straight barrel part diameter of not less than 17 cm and having excellent visible light transmittance produced by a single crystal pulling method.

SUMMARY OF THE INVENTION

The present inventors first succeeded in producing a large-sized as-grown single crystal of alkaline earth metal fluoride, specifically calcium fluoride, barium fluorine or the like, having excellent visible light transmittance by a single crystal pulling method, and accomplished the present invention.

That is to say, the as-grown single crystal of alkaline earth metal fluoride according to the present invention is a single crystal which is produced by a single crystal pulling method, which has a straight barrel part diameter of not less than 17 cm and a light transmittance, as measured at a wavelength of 632.8 nm, of not less than 80%, and whose main crystal growth plane is the {111} plane or the {100} plane. In the as-grown single crystal of alkaline earth metal fluoride of the invention, the alkaline earth metal is preferably calcium or barium.

DETAILED DESCRIPTION OF THE INVENTION

Figure 1:
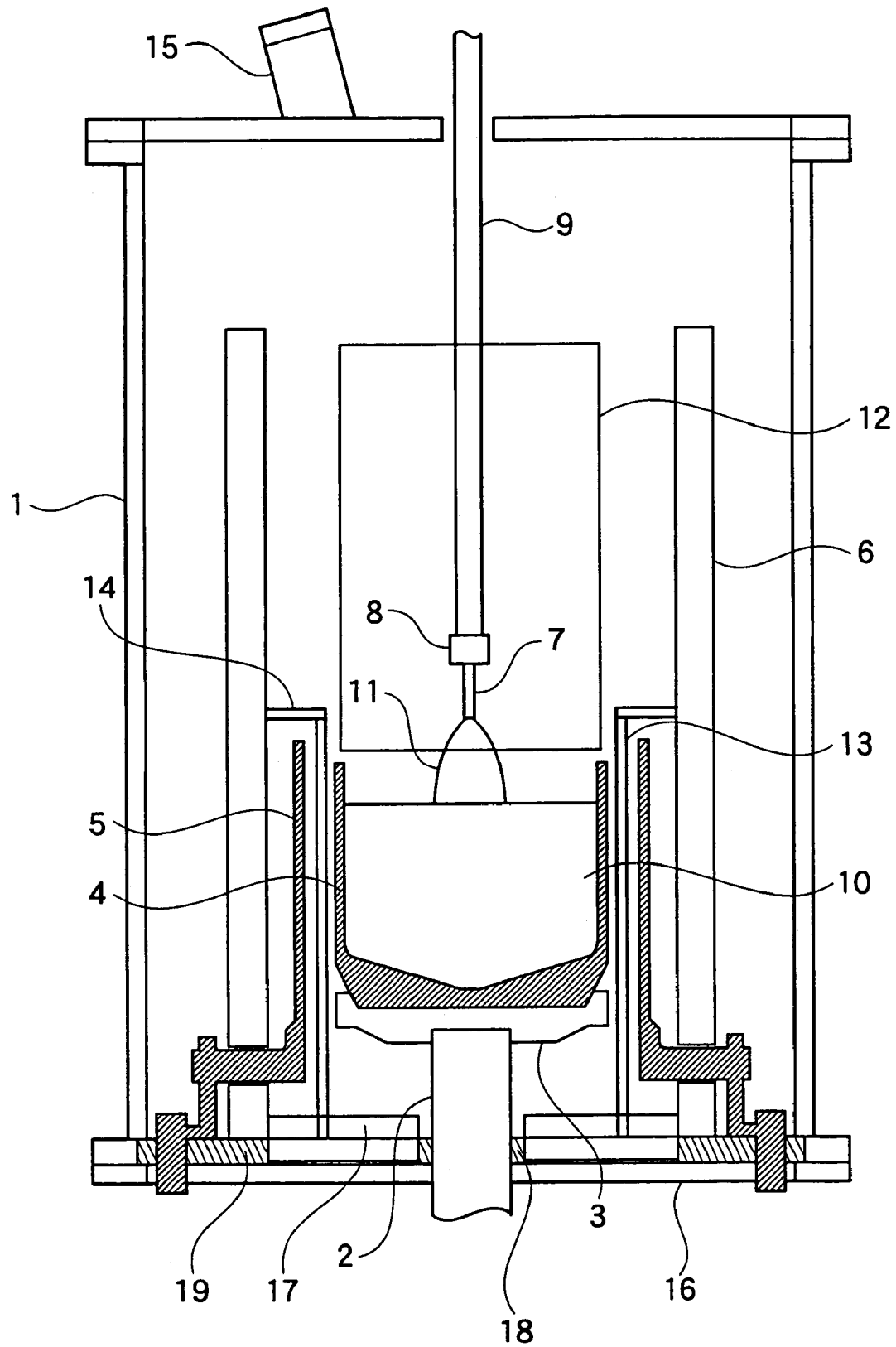
FIG. 1 is a schematic view of a single crystal pulling apparatus favorably used for producing the as-grown single crystal of alkaline earth metal fluoride of the present invention.

The single crystal of alkaline earth metal fluoride of the invention, specifically single crystal of calcium fluoride, barium fluoride or the like, is a single crystal in an as-grown state produced by a single crystal pulling method. The single crystal pulling method means the aforesaid single crystal production method generally called Czochralski method. The single crystal in an as-grown state means a single crystal having been pulled in a single crystal production apparatus and subjected to only cooling to room temperature, and is a single crystal having been subjected to no post treatment such as annealing treatment or polish of a surface of a straight barrel part.

The alkaline earth metal is preferably magnesium, calcium, strontium or barium, particularly preferably calcium or barium.

The main crystal growth plane of the as-grown single crystal is not specifically restricted, but it is usually the {111} plane or the {100} plane. The main crystal growth plane of the as-grown single crystal is a plane where crystal is grown by bringing a growth plane of the seed crystal into contact with a melt of a starting material for forming a single crystal, that is, a plane where crystal is grown in the lengthwise direction of the barrel part of the as-grown single crystal. In the present invention, the meaning of the {111} plane of a crystal includes a plane having symmetry property equal to that of the (111) plane, namely, each plane of (111), (11-1), (-111), (1-11), (-1-11), (1-1-1), (-11-1) and (-1-1-1). Likewise, the meaning of the {100} plane of a crystal includes each plane of (100), (010), (001), (-100), (0-10) and (00-1).

The as-grown single crystal whose main crystal growth plane is the {111} plane is extremely useful because a lens taking its optical axis on the {111} plane, which is expected to be used as a main lens of projection lenses, can be cut out from the single crystal. The as-grown single crystal whose main crystal growth plane is the {100} plane is also useful because a lens taking its optical axis on the {100} plane, which is expected as a projection lens used in combination with a lens taking its optical axis on the {111} plane, can be cut out from the single crystal.

The growth plane where crystal growth can be most easily performed is the {111} plane, and it is not easy to stably produce an as-grown single crystal whose main crystal growth plane is the {100} plane. On this account, the lens taking its optical axis on the {100} plane is usually manufactured by obliquely cutting the as-grown single crystal whose main crystal growth plane is the {111} plane. In the machining operation, however, cracks frequently occur, and the yield of machining the as-grown single crystal into lens is not satisfactory. Therefore, it is of extremely great value industrially to obtain an as-grown single crystal whose main crystal growth plane is the {100} plane and which has excellent transmittance.

The single crystal of the invention is a large-diameter single crystal having a straight barrel part diameter of not less than 17 cm, preferably 20 to 40 cm. The ingot grown by the single crystal pulling method generally consists of a shoulder part that is a conical part in which the diameter is gradually increased from that of the seed crystal, a straight barrel part that is a cylindrical part in which the diameter of the ingot is almost constant, and a tail part that is a conical part in which the diameter is gradually decreased from that of the straight barrel part. The diameter used herein means a diameter of the biggest portion of the straight barrel part.

The most striking feature of the present invention is that the visible light transmittance of the large-diameter as-grown single crystal of alkaline earth metal fluoride produced by the single crystal pulling method is remarkably increased. In the present invention, the visible light transmittance of the single crystal is evaluated by a light transmittance as measured at a wavelength of 632.8 nm. The as-grown single crystal of alkaline earth metal fluoride of the invention has a light transmittance, as measured at a wavelength of 632.8 nm, of not less than 80%, preferably 90 to 98%.

A light of the above measuring wavelength is violently absorbed by a large-sized opaque as-grown single crystal of alkaline earth metal fluoride obtained by the aforesaid single crystal pulling method conventionally known, and the light transmittance at the measuring wavelength is generally at most about 50% and is not satisfactory. In contrast, a high light transmittance has been realized in the large-sized as-grown single crystal of the invention, and the resulting single crystal is not opaque and has high transparency. Hence, evaluation of bubbles or inclusions in the crystal can be carried out by visual observation without performing complicated operations such as polish, and when the as-grown single crystal is used as an optical material for lithography, the yield can be remarkably increased.

In the present invention, the light transmittance of the as-grown single crystal is not a value measured at the specific portion of the single crystal, and it means an average value of light transmittances at 20 measuring points selected from the straight barrel part of the single crystal. The measuring wavelength used in the invention is a wavelength (632.8 nm) of He—Ne laser as previously described because it is a stable and inexpensive light source. The light transmittance at each measuring point is determined in the following manner. At each measuring point, a measuring light of the above wavelength is allowed to enter into the crystal perpendicularly to the direction of the crystal growth, and the transmitted light is allowed to exit from the opposite side in the diameter direction of the straight barrel part so that the optical path length should become maximum, to measure light intensity of the transmitted light.

In the single crystal, the measuring points are selected in the following manner. The straight barrel part of the single crystal is divided into 20 equal parts in the lengthwise direction (growth direction of single crystal), and on each circumference, one measuring point is arbitrarily selected. If the single crystal of the measuring object has a crack, the measuring point is selected in such a manner that the crack is not present on the optical path of the measuring light. If a visually observable bubble or micro-defect is included in the single crystal, the measuring point is selected by avoiding it, similarly to the above. When such a bubble or micro-defect cannot be avoided on a circumference of the equally divided 20 circumferences of the straight barrel part, the measuring point has only to be selected by moving the point in the vertical direction (growth direction of single crystal) within the necessary and minimum region.

In the single crystal of the invention, the length of the straight barrel part is preferably not less than 5 cm. When the length of the straight barrel part is not less than 5 cm, the numerical aperture of, for example, a lithographic lens obtained from the single crystal can be increased, and formation of an extremely fine projected pattern can be achieved.

Although the process for producing the single crystal of the invention having the above-mentioned properties is not specifically restricted, the single crystal of the invention can be preferably produced by the following process. That is to say, a single crystal pulling apparatus of the following structure is used.

The single crystal pulling apparatus used has a chamber, and in the chamber, a melting heater is provided around a crucible, the melting heater is surrounded with a heat-insulating wall, and the position of the upper end of the heat-insulating wall is set higher than the top of the single crystal pulling zone above the crucible. In the single crystal pulling apparatus, further, a barrier is provided between the melting heater and the outer edge of the crucible, the position of the upper end of the barrier is set higher than the upper end of the melting heater, and between the upper end of the barrier and the heat-insulating wall, a lid member to close the gap between the barrier and the heat-insulating wall is laid.

Using the single crystal pulling apparatus of the above structure, growth of a single crystal is carried out at a crystal pulling rate of not more than 4 mm/hr, preferably 0.5 to 3.5 mm/hr, whereby an as-grown single crystal of alkaline earth metal fluoride having the aforesaid light transmittance can be efficiently produced. According to the above process, further, an as-grown single crystal whose main crystal growth plane is the {100} plane, which is difficult to produce stably, can be favorably produced.

In FIG. 1, a single crystal pulling apparatus of the above structure is schematically shown.

The single crystal pulling apparatus of FIG. 1 has a chamber (1). In the chamber (1), a crucible (4) to be charged with a melt (10) of a starting material for forming a single crystal is mounted on a cradle (3) supported by a rotatable supporting shaft (2), and around the crucible (4), a melting heater (5) is provided. The melting heater (5) is surrounded with a heat-insulating wall (6). The height of the upper end of the melting heater (5) is usually almost the same as the height of the upper edge of the crucible (4).

Above the center axis of the crucible (4), a rotatable single crystal pulling bar (9) is hung, and to the tip of the pulling bar (9), a holder (8) to hold a seed crystal (7) is fitted. The seed crystal (7) is pulled after its lower end plane that is a growth plane is contacted with the starting material melt (10) in the crucible (4), and under the seed crystal (7), a single crystal (11) is grown. The lower end of the supporting shaft (2) passes through a bottom wall (16) of the chamber (1), extends outside the chamber, then comes into contact with a cooler (not shown) and is connected to a mechanism for rotating and vertically moving the crucible (4).

In the single crystal pulling apparatus of the above basic structure shown in FIG. 1, the heat-insulating wall (6) is provided more highly than a heat-insulating wall in a general-purpose single crystal pulling apparatus used for producing a single crystal of silicon or the like, and with the heat-insulating wall (6), not only the whole circumference of the crucible (4) (from the lower edge to the upper edge of the crucible) but also the single crystal pulling zone (12) above the crucible (4) is surrounded. That is to say, the position of the upper end of the heat-insulating wall (6) is higher than the top of the single crystal pulling zone (12).

The single crystal pulling zone (12) used herein means a zone from the height of the upper edge of the crucible (4) in the chamber (1) to the height that is reached by the upper end of the grown alkaline earth metal fluoride single crystal (11) (i.e., lower end plane of the seed crystal) when the pulling is completed. Although the top of the single crystal pulling zone (12) varies depending upon the length of the single crystal (11) pulled, it is generally higher than the upper edge of the crucible (4) by usually 50 to 300%, particularly preferably 100 to 200%, of the maximum inner diameter of the crucible.

The height of the upper end of the heat-insulating wall (6) is determined so that the single crystal pulling zone (12) of such a size as mentioned above should be sufficiently included in the surrounding heat-insulating wall (6). If the position of the upper end of the heat-insulating wall (6) is too much higher than the top of the single crystal pulling zone (12), the heat insulation effect is so high that a single crystal cannot be obtained. Therefore, the position of the upper end of the heat-insulating wall (6) is preferably selected from the same region as that for the top of the single crystal pulling zone (12).

In the present invention, as the heat-insulating wall (6), any of walls formed from known heat-insulating materials is adoptable without restriction. From the viewpoint of reduction of the internal strain of the single crystal (11), the coefficient of thermal conductivity of the heat-insulating wall (6) in the thickness direction is preferably not more than 50 W/m$^2$·K, more preferably 1 to 20 W/m$^2$·K, most preferably 3 to 15 W/m$^2$·K. The term "coefficient of thermal conductivity in the thickness direction" used herein means a value obtained by dividing an average thermal conductivity (W/m·K) at 1500° C. in the thickness direction of the object by a thickness (m) of the object.

The material of the heat-insulating wall (6) having such a coefficient of thermal conductivity is desirably a material having a thermal conductivity at 1500° C. of 0.2 to 1.0 W/m·K, preferably 0.3 to 0.8 W/m·K, and examples of such materials include a pitch type graphite molded heat-insulating material (specifically "Donacarbo" (trade name)), a fiber type graphite molded heat-insulating material, a carbon felt type heat-insulating material and a porous carbon type heat-insulating material. Of these, the pitch type graphite molded heat-insulating material is particularly preferably used because the desired coefficient of thermal conductivity can be attained and the resistance to severe pulling environment and the mechanical strength are excellent.

The heat-insulating wall (6) may be made of the above-mentioned single material, or may have a structure in which plural plates containing at least one heat-insulating plate are laminated, or may have a structure in which those plural plates are laminated interposing a gas phase between them, provided that the wall has excellent heat-insulting properties as a whole. Although the thickness of the heat-insulating wall (6) is not specifically restricted, it is generally in the range of 3 to 10 cm.

The location of the heat-insulting wall (6) is not specifically restricted provided that the wall (6) is located outside the melting heater (5) when the interior of the chamber (1) is seen from above. If the distance between the heat-insulating wall (6) and the outer edge of the crucible (4) is too far, the heat-insulating effect in the single crystal pulling zone (12) is lowered, so that the distance between them is in the range of preferably 20 to 100%, particularly preferably 30 to 60%, of the maximum inner diameter of the crucible (4).

In the production of the single crystal of the invention, the most important point is that in the single crystal pulling apparatus of the above structure, a barrier (13) is provided between the melting heater (5) and the outer edge of the crucible (4), the position of the upper end of the barrier (13) is higher than the position of the upper end of the melting heater (5), and between the upper end of the barrier (13) and the heat-insulating wall (6), a lid member (14) to close the gap between the barrier (13) and the heat-insulating wall (6) is laid. In this structure, the barrier (13) exerts effects of making the radiation heat from the melting heater (5) uniform and heating the crucible (4). The lid member (14) exerts an effect of preventing heat of the melting heater (5) from escaping upward. The opaqueness of the peripheral surface of a single crystal has a relation to a steep temperature drop of the single crystal surface, and for improving such a drop, it is effective to further enhance uniformity of the temperature in the vicinity of the liquid surface of the starting material melt and to perform cooling more slowly during the growth of a single crystal in the vicinity of the liquid surface of the starting material melt. Therefore, the above structure is very effective for the inhibition of opaqueness.

The position of the lid member (14) is preferably higher than the upper edge of the crucible (4) by 2 to 50%, particularly 3 to 20%, of the distance between the upper edge of the crucible (4) and the upper end of the heat-insulting wall (6).

The width of the lid member (14) (distance between the upper end of the barrier (13) and the heat-insulating wall (6)) is in the range of preferably 5 to 20%, more preferably 7 to 15%, of the inner diameter of the crucible. If the width is less than 5%, the heat-insulating effect sometimes becomes insufficient. If the width is more than 20%, the diameter of the single crystal is sometimes restricted to the size of the lid member.

The materials of the barrier (13) and the lid member (14) are preferably graphite and the like.

Although the type of the melting heater (5) is not specifically restricted, it is preferably a resistance heater. If the heater is an induction heater, the temperature distribution in the oven tends to become steep. Hence, the resistance heater is advantageous to obtain a single crystal of high quality.

In the single crystal pulling apparatus, it is preferable to hermetically seal the single crystal pulling bar (9), the supporting shaft (2), a peep window (15), etc. with an O-ring, a magnetic fluid seal and the like. If leakage occurs at such parts in the melting of the starting alkaline earth metal fluoride or the growth of a single crystal, marked deterioration of quality, such as coloring of single crystal or lowering of transparency, is liable to be brought about.

Prior to melting of the starting alkaline earth metal fluoride introduced into the crucible (4), the starting material is preferably subjected to heat treatment under vacuum to remove adsorption water. As a vacuum pump to evacuate the apparatus, a publicly known one is employable, but it is preferable to use a combination of a rotary pump and an oil diffusion pump or a combination of a rotary pump and a turbo molecule pump.

As shown in FIG. 1, a bottom heat insulator (17) is provided on the bottom wall (16) of the chamber (1) and on the inner side of the heat-insulating wall (6). Further, a heat-insulating supporting shaft hermetic sealer (18) is interposed between the circumference of the supporting shaft (2) and the bottom heat insulator (17). Furthermore, a heat-insulating bottom hermetic sealer (19) is interposed between the lower end of the heat-insulating wall (6), the circumference of the bottom heat insulator (17) and the melting heater (5).

By virtue of the above structure, heat is prevented from escaping from the bottom of the chamber (1), and besides leakage of the atmosphere of the chamber (1) is also prevented.

The materials of the bottom heat insulator (17), the supporting shaft hermetic sealer (18) and the bottom hermetic sealer (19) are not specifically restricted, and heat insulators or hermetic sealers made of known heat-insulating materials are adoptable without any restriction provided that they have the same coefficient of thermal conductivity as that of the heat-insulating wall (6) in the thickness direction.

In the most preferred single crystal pulling apparatus used for producing the single crystal of the invention, the coefficient of thermal conductivity of the heat-insulting wall (6) in the thickness direction is in the range of 3 to 15 W/m$^2$·K, the position of the upper end of the heat-insulating wall (6) is higher than the upper edge of the crucible (4) by 100 to 200% of the maximum inner diameter of the crucible, the position of the lid member (14) is higher than the upper edge of the crucible (4) by 3 to 20% of the distance between the upper edge of the crucible (4) and the upper end of the heat-insulting wall (6), and the distance between the heat-insulting wall (6) and the outer edge of the crucible (4) is in the range of 30 to 60% of the maximum inner diameter of the crucible (4).

In order to produce the single crystal of the invention by the use of the single crystal pulling apparatus of the above structure, it is important to grow a single crystal at a crystal pulling rate of not more than 4 mm/hr, preferably 0.5 to 3.5 mm/hr. If the crystal pulling rate exceeds 4 mm/hr, it becomes difficult to sufficiently reduce the light transmittance of the resulting single crystal.

With regard to the operations of other pulling methods, known operations which are performed by the use of a general single crystal pulling apparatus are adoptable without any restriction. It is preferable to use, as the starting alkaline earth metal fluoride introduced into the crucible, alkaline earth metal fluoride having been sufficiently subjected to purification treatment, particularly moisture removal treatment. Melting of the starting fluoride and growth of a single crystal can be carried out in an atmosphere of an inert gas or under vacuum.

Pulling of a single crystal is preferably carried out in such a manner that the temperature measured on the starting alkaline earth metal fluoride at the bottom of the crucible is as follows. In case of calcium fluoride, the pulling is preferably carried out at a temperature of not lower than 1380° C., preferably 1380 to 1480° C. In case of barium fluoride, the pulling is preferably carried out at a temperature of 1300 to 1400° C. The heating rate to reach this temperature is in the range of preferably 50 to 500° C./hr.

In order to remove an influence by the residual moisture, it is preferable to carry out the pulling method in the presence of a scavenger. The scavenger used herein is a solid scavenger fed with the starting alkaline earth metal fluoride, such as zinc fluoride, lead fluoride or polyethylene tetrafluoride, or a gas scavenger introduced into the chamber as a gas of the atmosphere, such as carbon tetrafluoride, carbon trifluoride or ethane hexafluoride. Of these, the solid scavenger is preferably employed, and the amount thereof is preferably in the range of 0.005 to 5 parts by weight based on 100 parts by weight of the starting alkaline earth metal fluoride.

The seed crystal used in the pulling method is a single crystal of alkaline earth metal fluoride, and the growth plane of the seed crystal is arbitrarily selected from the {111} plane, the {100} plane and the like according to the main crystal growth plane of the as-grown single crystal to be produced. During the growth of a single crystal, it is preferable to rotate the seed crystal on its pulling axis, and the rotational speed is preferably in the range of 2 to 20 rpm. With the rotation of the seed crystal, the crucible may also be rotated at the same rotational speed in the opposite direction to the rotational direction of the seed crystal.

After pulling of the single crystal, the temperature is lowered to ordinary temperature at a rate of preferably 0.1 to 3° C./min.

The as-grown single crystal of alkaline earth metal fluoride obtained as above may be processed by treatments such as cutting and polish to give an optical member of a desired shape. The birefringence of the single crystal is extremely small, but when the birefringence value is desired to be further decreased, the single crystal may be subjected to annealing treatment at 900 to 1300° C. for about 1 to 48 hours.

The single crystal of alkaline earth metal fluoride of the invention has a large diameter, and in spite that it is in an as-grown state, the peripheral surface is not opaque and the visible light transmittance is high.

Therefore, evaluation of bubbles or inclusions in the crystal becomes feasible without performing complicated machining of the crystal, and from the single crystal, a large-sized optical material having advantageous properties such as high quality and high uniformity can be cut out.

Accordingly, the single crystal of alkaline earth metal fluoride of the invention is useful for optical members, such as lenses, prisms, half mirrors and aperture materials, and is remarkably useful for these optical members particularly used with ultraviolet and vacuum ultraviolet lights, most preferably for materials used with F2 laser which is considered as a promising light source in the lithographic technology of the next generation.

EXAMPLE

The as-grown single crystal of alkaline earth metal fluoride of the present invention is further described with reference to the following examples, but it should be construed that the invention is in no way limited to those examples.

Example 1

Preparation of a calcium fluoride single crystal was carried out using a single crystal pulling apparatus shown in FIG. 1.

The crucible (4) made of high-purity graphite, which was set in the chamber (1), had an inner diameter of 38 cm (outer diameter: 40 cm) and a height of 30 cm. The heat-insulating wall (6) was a pitch type graphite molded heat insulator and had a coefficient of thermal conductivity of 9 $W/m^2 \cdot K$ in the thickness direction. The position of the upper end of the heat-insulating wall (6) was higher than the upper edge of the crucible (4) by 160% of the maximum inner diameter of the crucible (4). The position of the lid member (14) was higher than the upper edge of the crucible (4) by 10% (6 cm) of the distance between the upper edge of the crucible (4) and the upper end of the heat-insulting wall (6). The width of the lid member (14) was 10% (3.8 cm) of the inner diameter of the crucible (4). The distance between the barrier (13) and the outer edge of the crucible (4) was 4 cm. The distance between the heat-insulating wall (6) and the outer edge of the crucible (4) was 9 cm (25% of the maximum inner diameter of the crucible (4)).

Into the crucible (4) set in the chamber (1) were introduced, as a starting material, 50 kg of a lump of high-purity calcium fluoride having been subjected to purification treatment and moisture removal treatment sufficiently and, as a scavenger, 0.1% high-purity zinc fluoride, followed by evacuating the chamber. With the holder (8) fitted to the tip of the single crystal pulling bar (9), a seed crystal (7) made of a single crystal of calcium fluoride, whose lower end plane (growth plane) was the (111) plane, was held.

Then, an electric current was applied to the melting heater (5) to start heating of the starting material, and the temperature was raised up to 250° C. at a rate of about 50° C./hr, followed by keeping this temperature for 2 hours. After the temperature was kept, the temperature was raised again at a rate of about 100° C./hr. When a temperature of 600° C. was reached, the evacuation line was shut down, and high-purity argon gas was fed to the chamber (1) to keep the internal pressure at 106.4 KPa.

At 1480° C., the starting material was completely melted, and this temperature was kept for 40 minutes. Thereafter, the heater power was lowered to keep the temperature at 1440° C. for 120 hours. Then, the pulling bar (9) was perpendicularly depressed to bring the growth plane of the seed crystal (7) into contact with the surface of the starting material melt (10), whereby growth of a single crystal was started. Pulling of a single crystal was conducted for 100 hours at a rate of 2 mm/hr with rotating the seed crystal (7) at 5 rpm and also rotating the crucible (4) at 1 rpm in the opposite direction to the rotational direction of the seed crystal (7). As a result, growth of a single crystal could be carried out satisfactorily. After the growth was completed, the temperature was lowered to ordinary temperature at a rate of 0.9° C./min.

Through the above process, an as-grown single crystal of calcium fluoride having a maximum diameter of 28 cm and a weight of 27 kg was prepared. The length of the straight barrel part of the as-grown single crystal was 10 cm. The main crystal growth plane of the as-grown single crystal was examined by the use of X-ray diffraction photograph, and as a result, it was the (111) plane.

The light transmittance of the as-grown single crystal at a wavelength of 632.8 nm was measured in the following manner.

First, light intensity of He—Ne laser beam (632.8 nm) was measured without a single crystal, using the photo power meter. Subsequently, the straight barrel part of the as-grown single crystal was divided into 20 equal parts in the lengthwise direction, and on each circumference one measuring point was arbitrarily selected. Then, the straight barrel part was inserted into an optical path of the laser beam in such a manner that the optical path was perpendicular to the crystal growth direction and the optical path length became maximum, to measure light intensity at each measuring point. From the ratio of this light intensity to the light intensity measured without a single crystal, a light transmittance at the above wavelength was determined. An average of the light transmittances obtained at the measuring points was calculated to determine a light transmittance of the as-grown single crystal. As a result, the light transmittance was 93.2%.

Example 2

Pulling of a calcium fluoride single crystal was carried out in the same manner as in Example 1, except that in the single crystal pulling apparatus of FIG. 1, the position of the lid member (14) was set higher than the upper edge of the crucible (4) by 15% (9 cm) of the distance between the upper edge of the crucible (4) and the upper end of the heat-insulating wall (6). As a result, an as-grown single crystal of calcium fluoride having a maximum diameter of 28 cm and a weight of 16.2 kg was prepared. The length of the straight barrel part of the as-grown single crystal was 6 cm. The main crystal growth plane was the (111) plane.

Measurement of a light transmittance of the as-grown single crystal at a wavelength of 632.8 nm resulted in 96.1%.

Example 3

Pulling of a calcium fluoride single crystal was carried out in the same manner as in Example 1, except that pulling of the single crystal was conducted at a rate of 3 mm/hr. As a result, an as-grown single crystal of calcium fluoride having a maximum diameter of 25 cm and a weight of 13.0 kg was prepared. The length of the straight barrel part of the as-grown single crystal was 6 cm. The main crystal growth plane was the (111) plane.

Measurement of a light transmittance of the as-grown single crystal at a wavelength of 632.8 nm resulted in 91.8%.

Comparative Example 1

Pulling of a calcium fluoride single crystal was carried out in the same manner as in Example 1, except that in the single crystal pulling apparatus of FIG. 1, the lid member (14) was not provided. As a result, an as-grown single crystal of calcium fluoride having a straight barrel part maximum diameter of 22 cm and a weight of 10.0 kg was prepared.

The length of the straight barrel part of the as-grown single crystal was 6 cm. The main crystal growth plane was the (111) plane.

Measurement of a light transmittance of the as-grown single crystal at a wavelength of 632.8 nm resulted in 70.4%.

Comparative Example 2

Pulling of a calcium fluoride single crystal was carried out in the same manner as in Example 1, except that pulling of the single crystal was conducted at a rate of 10 mm/hr. As a result, an as-grown single crystal of calcium fluoride having a maximum diameter of 20 cm and a weight of 8.3 kg was prepared. The length of the straight barrel part of the as-grown single crystal was 6 cm. The main crystal growth plane was the (111) plane.

Measurement of a light transmittance of the as-grown single crystal at a wavelength of 632.8 nm resulted in 66.0%.

Example 4

Pulling of a calcium fluoride single crystal was carried out in the same manner as in Example 1, except that a single crystal of calcium fluoride whose lower end plane (growth plane) was the (100) plane was used as the seed crystal (7). As a result, an as-grown single crystal of calcium fluoride having a maximum diameter of 22 cm and a weight of 16.1 kg was prepared. The length of the straight barrel part of the as-grown single crystal was 8 cm. The main crystal growth plane was the (100) plane.

Measurement of a light transmittance of the as-grown single crystal at a wavelength of 632.8 nm resulted in 91.5%.

Example 5

Pulling of a calcium fluoride single crystal was carried out in the same manner as in Example 2, except that a single crystal of calcium fluoride whose lower end plane (growth plane) was the (100) plane was used as the seed crystal (7). As a result, an as-grown single crystal of calcium fluoride having a maximum diameter of 24 cm and a weight of 19.2 kg was prepared. The length of the straight barrel part of the as-grown single crystal was 8 cm. The main crystal growth plane was the (100) plane.

Measurement of a light transmittance of the as-grown single crystal at a wavelength of 632.8 nm resulted in 96.6%.

Example 6

Pulling of a calcium fluoride single crystal was carried out in the same manner as in Example 3, except that a single crystal of calcium fluoride whose lower end plane (growth plane) was the (100) plane was used as the seed crystal (7). As a result, an as-grown single crystal of calcium fluoride having a maximum diameter of 22 cm and a weight of 12.1 kg was prepared. The length of the straight barrel part of the as-grown single crystal was 6 cm. The main crystal growth plane was the (100) plane.

Measurement of a light transmittance of the as-grown single crystal at a wavelength of 632.8 nm resulted in 91.9%.

Comparative Example 3

Pulling of a calcium fluoride single crystal was carried out in the same manner as in Comparative Example 1, except that a single crystal of calcium fluoride whose lower end plane (growth plane) was the (100) plane was used as the seed crystal (7). As a result, an as-grown single crystal of calcium fluoride having a maximum diameter of 20 cm and a weight of 10.0 kg was prepared. The length of the straight barrel part of the as-grown single crystal was 6 cm. The main crystal growth plane was the (100) plane.

Measurement of a light transmittance of the as-grown single crystal at a wavelength of 632.8 nm resulted in 78.6%.

Comparative Example 4

Pulling of a calcium fluoride single crystal was carried out in the same manner as in Comparative Example 2, except that a single crystal of calcium fluoride whose lower end plane (growth plane) was the (100) plane was used as the seed crystal (7). As a result, an as-grown single crystal o f calcium fluoride having a maximum diameter of 22 cm and a weight of 10.1 kg was prepared. The length of the straight barrel part of the as-grown single crystal was 5 cm. The main crystal growth plane was the (100) plane.

Measurement of a light transmittance of the as-grown single crystal at a wavelength of 632.8 nm resulted in 77.8%.

Example 7

Preparation of a barium fluoride single crystal was carried out using a single crystal pulling apparatus, which is used in Example 1, shown in FIG. 1.

Into the crucible (4) set in the chamber (1) were introduced, as a starting material, 75 kg of a lump of high-purity barium fluoride having been subjected to purification treatment and moisture removal treatment sufficiently and, as a scavenger, 0.1% high-purity zinc fluoride, followed by evacuating the chamber. With the holder (8) fitted to the tip of the single crystal pulling bar (9), a seed crystal (7) made of a single crystal of barium fluoride, whose lower end plane (growth plane) was the (111) plane, was held.

Then, an electric current was applied to the melting heater (5) to start heating of the starting material, and the temperature was raised up to 250° C. at a rate of about 50° C./hr, followed by keeping this temperature for 2 hours. After the temperature was kept, the temperature was raised again at a rate of about 100° C./hr. When a temperature of 600° C. was reached, the evacuation line was shut down, and high-purity argon gas was fed to the chamber (1) to keep the internal pressure at 106.4 KPa.

At 1400° C., the starting material was completely melted, and this temperature was kept for 40 minutes. Thereafter, the heater power was lowered to keep the temperature at 1360° C. for 120 hours. Then, the pulling bar (9) was perpendicularly depressed to bring the lower end plane of the seed crystal (7) into contact with the surface of the starting material melt (10), whereby growth of a single crystal was started. Pulling of a single crystal was conducted for 100 hours at a rate of 2 mm/hr with rotating the seed crystal (7) at 5 rpm and also rotating the crucible (4) at 1 rpm in the opposite direction to the rotational direction of the seed crystal (7). As a result, growth of a single crystal could be carried out satisfactorily. After the growth was completed, the temperature was lowered to ordinary temperature at a rate of 0.9° C./min.

Through the above process, an as-grown single crystal of barium fluoride having a maximum diameter of 28 cm and a weight of 41 kg was prepared. The length of the straight barrel part of the as-grown single crystal was 10 cm. The main crystal growth plane was the (111) plane.

Measurement of a light transmittance of the as-grown single crystal at a wavelength of 632.8 nm resulted in 94.9%.

Example 8

Pulling of a barium fluoride single crystal was carried out in the same manner as in Example 7, except that in the single crystal pulling apparatus of FIG. 1, the position of the lid member (14) was set higher than the upper edge of the crucible (4) by 15% (9 cm) of the distance between the upper edge of the crucible (4) and the upper end of the heat-insulating wall (6). As a result, an as-grown single crystal of barium fluoride having a maximum diameter of 28 cm and a weight of 24.6 kg was prepared. The length of the straight barrel part of the as-grown single crystal was 6 cm. The main crystal growth plane was the (111) plane.

Measurement of a light transmittance of the as-grown single crystal at a wavelength of 632.8 nm resulted in 97.1%.

Example 9

Pulling of a barium fluoride single crystal was carried out in the same manner as in Example 7, except that pulling of the single crystal was conducted at a rate of 3 mm/hr. As a result, an as-grown single crystal of barium fluoride having a maximum diameter of 25 cm and a weight of 19.8 kg was prepared. The length of the straight barrel part of the as-grown single crystal was 6 cm. The main crystal growth plane was the (111) plane.

Measurement of a light transmittance of the as-grown single crystal at a wavelength of 632.8 nm resulted in 92.6%.

Comparative Example 5

Pulling of a barium fluoride single crystal was carried out in the same manner as in Example 7, except that in the single crystal pulling apparatus of FIG. 1, the lid member (14) was not provided. As a result, an as-grown single crystal of barium fluoride having a straight barrel part maximum diameter of 22 cm and a weight of 15.2 kg was prepared. The length of the straight barrel part of the as-grown single crystal was 6 cm. The main crystal growth plane was the (111) plane.

Measurement of a light transmittance of the as-grown single crystal at a wavelength of 632.8 nm resulted in 68.9%.

Comparative Example 6

Pulling of a barium fluoride single crystal was carried out in the same manner as in Example 7, except that pulling of the single crystal was conducted at a rate of 10 mm/hr. As a result, an as-grown single crystal of barium fluoride having a maximum diameter of 20 cm and a weight of 12.6 kg was prepared. The length of the straight barrel part of the as-grown single crystal was 6 cm. The main crystal growth plane was the (111) plane.

Measurement of a light transmittance of the as-grown single crystal at a wavelength of 632.8 nm resulted in 70.6%.

Example 10

Pulling of a barium fluoride single crystal was carried out in the same manner as in Example 7, except that a single crystal of barium fluoride whose lower end plane (growth plane) was the (100) plane was used as the seed crystal (7). As a result, an as-grown single crystal of barium fluoride having a maximum diameter of 26 cm and a weight of 25.6 kg was prepared. The length of the straight barrel part of the as-grown single crystal was 6 cm. The main crystal growth plane was the (100) plane.

Measurement of a light transmittance of the as-grown single crystal at a wavelength of 632.8 nm resulted in 94.3%.

Example 11

Pulling of a barium fluoride single crystal was carried out in the same manner as in Example 8, except that a single crystal of barium fluoride whose lower end plane (growth plane) was the (100) plane was used as the seed crystal (7). As a result, an as-grown single crystal of barium fluoride having a maximum diameter of 25 cm and a weight of 27.7 kg was prepared. The length of the straight barrel part of the as-grown single crystal was 7 cm. The main crystal growth plane was the (100) plane.

Measurement of a light transmittance of the as-grown single crystal at a wavelength of 632.8 nm resulted in 96.5%.

Comparative Example 7

Pulling of a barium fluoride single crystal was carried out in the same manner as in Comparative Example 5, except that a single crystal of barium fluoride whose lower end plane (growth plane) was the (100) plane was used as the seed crystal (7). As a result, an as-grown single crystal of barium fluoride having a maximum diameter of 23 cm and a weight of 20.1 kg was prepared. The length of the straight barrel part of the as-grown single crystal,was 6 cm. The main crystal growth plane was the (100) plane.

Measurement of a light transmittance of the as-grown single crystal at a wavelength of 632.8 nm resulted in 67.7%.

Comparative Example 8

Pulling of a barium fluoride single crystal was carried out in the same manner as in Comparative Example 6, except that a single crystal of barium fluoride whose lower end plane (growth plane) was the (100) plane was used as the seed crystal (7). As a result, an as-grown single crystal of barium fluoride having a maximum diameter of 21 cm and a weight of 16.7 kg was prepared. The length of the straight barrel part of the as-grown single crystal was 6 cm. The main crystal growth plane was the (100) plane.

Measurement of a light transmittance of the as-grown single crystal at a wavelength of 632.8 nm resulted in 69.8%.

What is claimed is:

1. An as-grown single crystal of alkaline earth metal fluoride produced by a single crystal pulling method and having a straight barrel part diameter of not less than 17 cm and a light transmittance, as measured at a wavelength of 632.8 nm, of not less than 80%, wherein the as-grown crystal is non-annealed.

2. The as-grown single crystal of alkaline earth metal fluoride as claimed in claim 1, wherein the main crystal growth plane is the {111} plane.

3. The as-grown single crystal of alkaline earth metal fluoride as claimed in claim 1, wherein the main crystal growth plane is the {100} plane.

4. The as-grown single crystal of alkaline earth metal fluoride as claimed in claim 1, wherein the straight barrel part has a length of not less than 5 cm.

5. The as-grown single crystal of alkaline earth metal fluoride as claimed in claim 1, wherein the alkaline earth metal fluoride is calcium fluoride.

6. The as-grown single crystal of alkaline earth metal fluoride as claimed in claim 1, wherein the alkaline earth metal fluoride is barium fluoride.

7. The as-grown single crystal of alkaline earth metal fluoride as claimed in claim 2, wherein the straight barrel part has a length of not less than 5 cm.

8. The as-grown single crystal of alkaline earth metal fluoride as claimed in claim 3, wherein the straight barrel part has a length of not less than 5 cm.

9. The as-grown single crystal of alkaline earth metal fluoride as claimed in claim 2, wherein the alkaline earth metal fluoride is calcium fluoride.

10. The as-grown single crystal of alkaline earth metal fluoride as claimed in claim 3, wherein the alkaline earth metal fluoride is calcium fluoride.

11. The as-grown single crystal of alkaline earth metal fluoride as claimed in claim 4, wherein the alkaline earth metal fluoride is calcium fluoride.

12. The as-grown single crystal of alkaline earth metal fluoride as claimed in claim 2, wherein the alkaline earth metal fluoride is barium fluoride.

13. The as-grown single crystal of alkaline earth metal fluoride as claimed in claim 3, wherein the alkaline earth metal fluoride is barium fluoride.

14. The as-grown single crystal of alkaline earth metal fluoride as claimed in claim 4, wherein the alkaline earth metal fluoride is barium fluoride.

* * * * *